(12) United States Patent
Prasher

(10) Patent No.: US 7,365,980 B2
(45) Date of Patent: Apr. 29, 2008

(54) MICROPIN HEAT EXCHANGER

(75) Inventor: Ravi Prasher, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/713,236

(22) Filed: Nov. 13, 2003

(65) Prior Publication Data

US 2005/0105272 A1    May 19, 2005

(51) Int. Cl.
    H05K 7/20 (2006.01)
(52) U.S. Cl. ............... 361/699; 361/689; 361/698; 257/714; 165/80.4
(58) Field of Classification Search .............. 361/689, 361/696, 698, 699, 717–719; 257/714, 722; 174/15.1, 16.3; 165/80.3, 80.4
    See application file for complete search history.

(56) References Cited

U.S. PATENT DOCUMENTS

| | | | | |
|---|---|---|---|---|
| 5,344,795 A | * | 9/1994 | Hashemi et al. ........ | 264/272.15 |
| 5,587,880 A | * | 12/1996 | Phillips et al. ............. | 361/687 |
| 5,666,269 A | * | 9/1997 | Romero et al. ............ | 361/699 |
| 5,898,570 A | * | 4/1999 | Koon et al. ................. | 361/704 |
| 6,578,626 B1 | * | 6/2003 | Calaman et al. ........... | 165/80.4 |
| 6,653,730 B2 | * | 11/2003 | Chrysler et al. ............ | 257/704 |
| 6,679,315 B2 | * | 1/2004 | Cosley et al. ............. | 165/80.4 |
| 6,729,383 B1 | * | 5/2004 | Cannell et al. ............. | 165/80.3 |
| 6,771,508 B1 | * | 8/2004 | Ghosh ........................ | 361/704 |
| 6,820,684 B1 | * | 11/2004 | Chu et al. ............... | 165/104.33 |
| 6,986,382 B2 | * | 1/2006 | Upadhya et al. ........... | 165/80.4 |
| 2001/0027855 A1 | | 10/2001 | Budelman | |
| 2002/0185260 A1 | | 12/2002 | Calaman et al. | |
| 2003/0136547 A1 | | 7/2003 | Gollan et al. | |
| 2004/0112571 A1 | * | 6/2004 | Kenny et al. ............. | 165/80.3 |
| 2004/0206477 A1 | * | 10/2004 | Kenny et al. ............. | 165/80.4 |
| 2005/0104200 A1 | | 5/2005 | Myers et al. | |

FOREIGN PATENT DOCUMENTS

| | | |
|---|---|---|
| EP | 0542478 | 5/1993 |
| JP | 01-087118 | 3/1989 |
| KR | 0158783 | 12/1998 |
| KR | 10-2002-0088300 | 11/2002 |
| KR | 10-2003-0068633 | 8/2003 |
| WO | WO-05050737 | 6/2005 |

OTHER PUBLICATIONS

"U.S. Appl. No. 10/903,185, Final Office Action mailed Oct. 11, 2007", 9 pgs.
"U.S. Appl. No. 10/903,185, Final Office Action mailed Oct. 20, 2006", 8 pgs.
"U.S. Appl. No. 10/903,185, Non-Final Office Action mailed Dec. 1, 2005", 7 pgs.
"U.S. Appl. No. 10-903,185, Non-Final Office Action mailed Apr. 7, 2006", 7 pgs.

(Continued)

Primary Examiner—Boris Chèrvinsky
(74) Attorney, Agent, or Firm—Schwegman, Lundberg & Woessner, P.A.

(57) ABSTRACT

An apparatus including a micropin thermal solution is described. The apparatus comprises a substrate and a number of micropins thermally coupled to the substrate. The micropins are arranged in a pixel like pattern over the substrate.

39 Claims, 5 Drawing Sheets

OTHER PUBLICATIONS

"U.S. Appl. No. 10/903,185, Non-Final Office Action mailed May 8, 2007", 9 pgs.

"U.S. Appl. No. 10/903,185, Response filed Jan. 31, 2006 Non-Final Office Action mailed Dec. 1, 2005", 10 pgs.

"U.S. Appl. No. 10/903,185, Response filed Mar. 20, 2007 Final Office Action mailed Oct. 20, 2006", 11 pgs.

"U.S. Appl. No. 10/903,185, Response filed Aug. 2, 2006 Non-Final Office Action mailed Apr. 7, 2006", 11 pgs.

"U.S. Appl. No. 10/903,185 Response filed Aug. 8, 2007 Non-Final Office Action mailed May 8, 2007", 14 pgs.

"U.S. Appl. No. 10/903,185 Response filed Oct. 31, 2007 to Final Office Action mailed Oct. 11, 2007", 12 pgs.

"PCT Appl. No. PCT/US2004/036823, International Search Report mailed Mar. 3, 2005", 4 pgs.

"PCT Appl. No. PCT/US2004/036823, Written Opinion mailed Mar. 3, 2005", 7 pgs.

* cited by examiner

MICROPIN HEAT EXCHANGER

TECHNICAL FIELD

The invention generally relates to cooling electronic apparatuses and systems, and in particular, but not exclusively relates to micro-cooling technology.

BACKGROUND INFORMATION

As electronic devices become more powerful and smaller (i.e., more densely packed), the power consumed by these electronic devices can result in a large amount of generated heat. The heat generated by these electronic devices may be detrimental to the operation of the electronic devices. Accordingly, a common concern associated with electronic components is heat removal.

For example, an electronic device may include an integrated circuit (IC) die. A thermal solution may be thermally coupled to the IC die to facilitate dissipation of heat from the IC die. Commonly, the thermal solution may be in the form of a heat sink having a number of fins or channels (i.e., a passive solution). As air passes by the fins or channels, heat may be transferred from the IC die to the surrounding air via the fins or channels. Alternatively, an active solution may be in the form of forced fluid across the fins or channels. However, utilizing fins or channels do not provide efficient and uniform removal of heat from the IC die due to various effects such as, but not limited to, variations of heat generation from different areas on the IC die.

BRIEF DESCRIPTION OF THE DRAWINGS

The various embodiments of the invention is illustrated by way of example and not by way of limitation in the figures of the accompanying drawings, in which the like references indicate similar elements and in which.

DETAILED DESCRIPTION

In various embodiments, an apparatus including a micropin thermal solution is described. In the following description, various embodiments will be described. However, one skilled in the relevant art will recognize that the various embodiments may be practiced without one or more of the specific details, or with other methods, materials, components, etc. In other instances, well-known structures, materials, or operations are not shown or described in detail to avoid obscuring aspects of various embodiments of the invention. Similarly, for purposes of explanation, specific numbers, materials and configurations are set forth in order to provide a thorough understanding of the invention. Nevertheless, the invention may be practiced without the specific details. In other instances, well-known features are omitted or simplified in order not to obscure the invention. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention. Thus, the appearances of the phrases "in one embodiment" or "in an embodiment" in various places throughout this specification are not necessarily all referring to the same embodiment or invention. Furthermore, the particular features, structures, materials, or characteristics may be combined in any suitable manner in one or more embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation.

Figure 1A:
FIGS. 1a–1b illustrate an apparatus having a micropin thermal solution, in accordance with one embodiment of the invention.
Figure 1B:
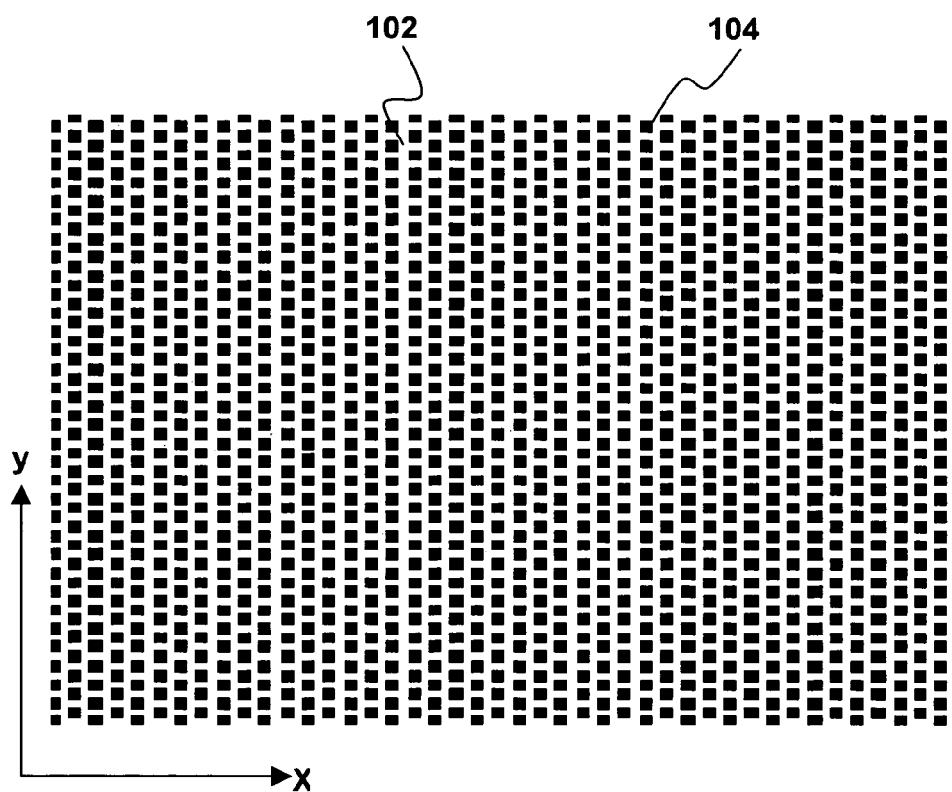

FIGS. 1a–1b illustrate an apparatus having a micropin thermal solution, in accordance with one embodiment of the invention. Illustrated in FIG. 1a is a side like view of an apparatus 100. In FIG. 1a, the apparatus 100 includes a substrate 102 and a number of micropins 104. FIG. 1b illustrates a top like view of the apparatus 100. Accordingly, as shown in FIG. 1b, the micropins 104 are arranged in a pixel like pattern over the substrate 102, in accordance with various embodiments of the invention.

Referring to FIG. 1b, the micropins 104 may be arranged to provide a predetermined space between the micropins 104. As will be described in more detail, the predetermined space may be based at least in part on the material that flows through the space such as, but not limited to water in liquid form. Further, the micropins 104 arranged in the pixel like pattern shown in FIG. 1b facilitates flow of material in all directions such as, but not limited to, at least two directions (e.g., the x-direction and the y-direction) as viewed in FIG. 1b.

In the illustrated embodiment shown in FIG. 1a, the micropins 104 may be formed from the substrate 102. That is, various etching methods may be utilized to form the micropins 104 from the substrate 102 such as, but not limited to, deep reactive ion etching (DRIE), wet etching, micromachining, and the like. Accordingly, the micropins 104 may be made of a semiconductor material, such as but not limited to silicon. Alternatively, the micropins 104 may be formed and disposed on the substrate 102. That is, the micropins 104 may be made of a variety of materials and methods such as, but not limited to, metals (e.g., copper) and micromachining methods, and subsequently disposed on the substrate. Additionally, the substrate 102 may be an integrated circuit (IC) die. Alternatively, the substrate 102 may be thermally coupled to an IC die.

The thermal energy (i.e., heat) from the substrate may be transferred to the micropins 104. Because in one embodiment, the micropins 104 are formed on the substrate 102, the micropins 104 may be thermally coupled to the IC die, and in turn, the micropins 104 facilitate transfer of heat to the material in substantial contact with the micropins 104.

Alternatively, the micropins 104 may be thermally coupled to the substrate, which in turn, may be thermally coupled to an IC die. That is, effectively, the micropins 104 are thermally coupled to the IC die.

Figure 2:
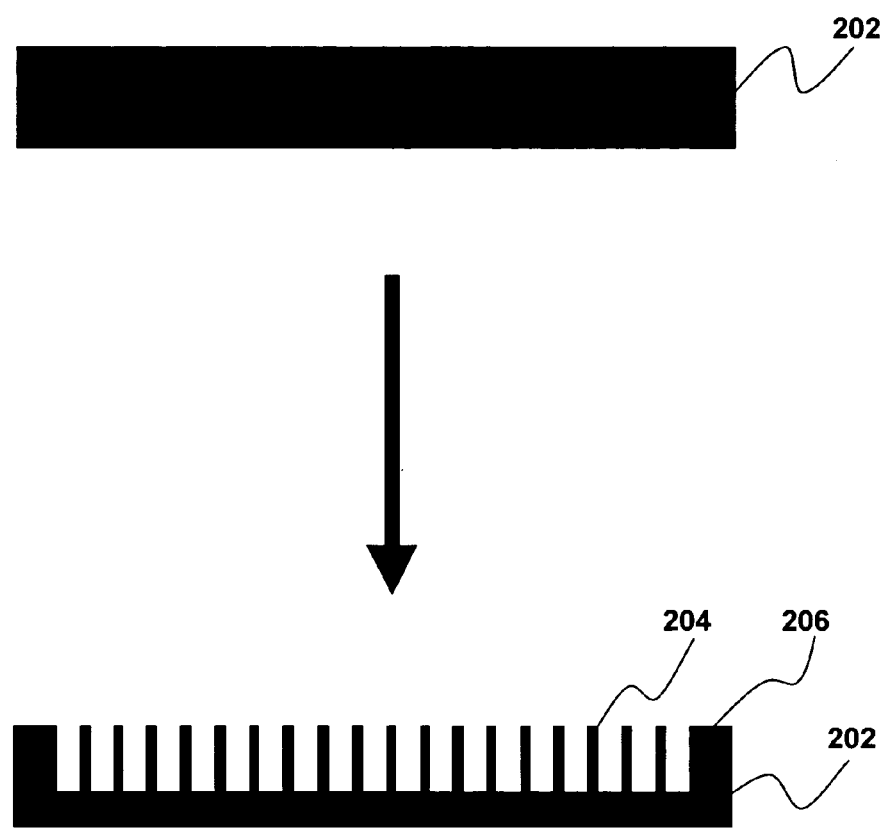
FIG. 2 illustrate a method of forming micropins, in accordance with one embodiment.

FIG. 2 illustrate a method of forming micropins, in accordance with one embodiment. Shown in FIG. 2 is a side like view of a substrate 202. The substrate 202 may be made of a suitable material to facilitate heat transfer such as, but not limited to, silicon based material, and a metal based material (e.g., silicon, copper, etc.). Various etching methods may be applied to the substrate 202 such as, but not limited to, DRIE, wet etching, micromachining, and so forth. As a result of the etching process, a number of micropins 204 may be formed from the substrate 202.

In the illustrated embodiment, formed along with the micropins 204 may be a side wall 206. As will be described in further detail, in various embodiments, the side wall 206 facilitates substantial enclosure of the micropins 204 within a device to facilitate heat removal from an integrated circuit (IC) die, and a cover may further facilitate the enclosure of the micropins 204.

Figure 3:
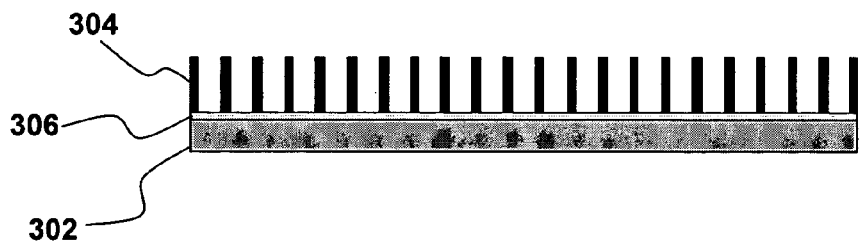
FIG. 3 illustrates an apparatus having a micropin thermal solution, in accordance with an alternate embodiment.

FIG. 3 illustrates an apparatus having a micropin thermal solution, in accordance with an alternate embodiment. In FIG. 3, a side like view is illustrated of an apparatus 300. The apparatus 300 includes a substrate 302 and a number of micropins 304 similar to the apparatus 100 shown in FIGS. 1a–1b. However, illustrated in FIG. 3, the apparatus 300 includes an interface layer 306 disposed between the micropins 304 and the substrate 302.

In accordance with one embodiment, the interface layer 306 may be of a material to provide structural support for the micropins 304 and facilitate thermal coupling such as, but not limited to, a diamond film. As previously described, the micropins 304 may be made of a semiconductor material, and accordingly, the interface layer may provide structural support for the micropins 304 and facilitate thermal coupling (i.e., heat transfer) from the substrate 302 to the micropins 304. Here again, the substrate may be an IC die or a substrate that may be thermally coupled to an IC die.

In one embodiment, the interface layer 306 may be made of a solderable material having various thermal properties such as, but not limited to, copper (Cu), gold (Au), nickel (Ni), aluminum (Al), titanium (Ti), tantalum (Ta), silver (Ag), Platinum (Pt), and any combination thereof. Accordingly, in one embodiment, the micropins 304 may be made of a metal material such as, but not limited to, copper.

Continuing to refer to FIG. 3, it should be appreciated by those skilled in the relevant art that in addition to the interface material 306, various adhesive materials (not shown) may be utilized between the micropins 304 and the substrate 302.

Figure 4:
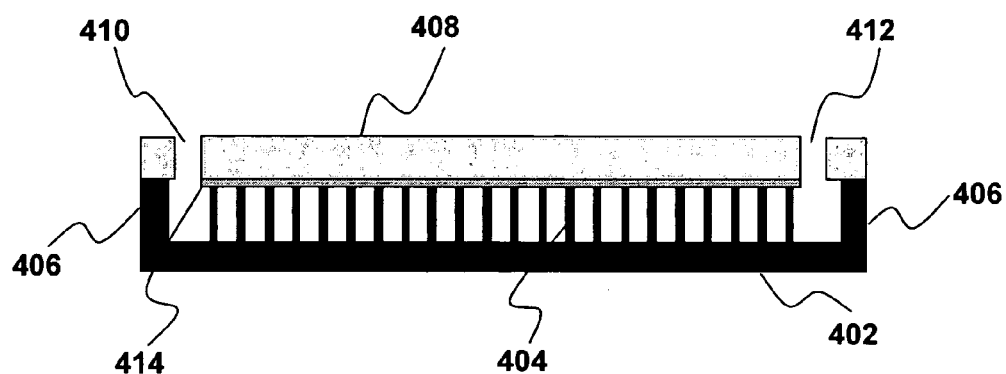
FIG. 4 illustrates an apparatus having a micropin thermal solution, in accordance with another embodiment.

FIG. 4 illustrates an apparatus having a micropin thermal solution, in accordance with another embodiment. Illustrated in FIG. 4, is a cross-sectional type view of an apparatus having a device 400. The device 400 includes substrate 402 and a number of micropins 404. As shown in the embodiment, the substrate 402 provides a bottom of the device 400. Additionally, the device 400 includes a wall 406 that substantially surround the micropins 404. Further, a cover 408 disposed over the micropins 404 results in the micropins 404 being substantially enclosed in the device 400.

The micropins 404 and the side wall 406 may both be formed from the substrate 402 as previously described in FIG. 2. The cover 408 may be attached to the micropins 404 by various attachment methods such as but not limited to, solder, adhesive, anodic bonding, thermal compression bonding, and so forth. Additionally, the cover may be made of various materials such as, but not limited to, acrylic based material (e.g., plexiglas® from Rohm & Haas Corporation of Philadelphia, Pa.).

The device 400 has an inlet 410 and an outlet 412. As will be described in detail, the inlet 410 and the outlet 412 facilitates flow of material through the micropins 404. Additionally, in FIG. 4, an interface layer 414 is shown between the cover 406 and the micropins 404. The interface layer 414 may be any type of layer that facilitates a seal between the cover 406 and the micropins 404. Accordingly, the interface layer 414 may be of a solderable material, adhesive material, or any combination thereof.

Figure 5:
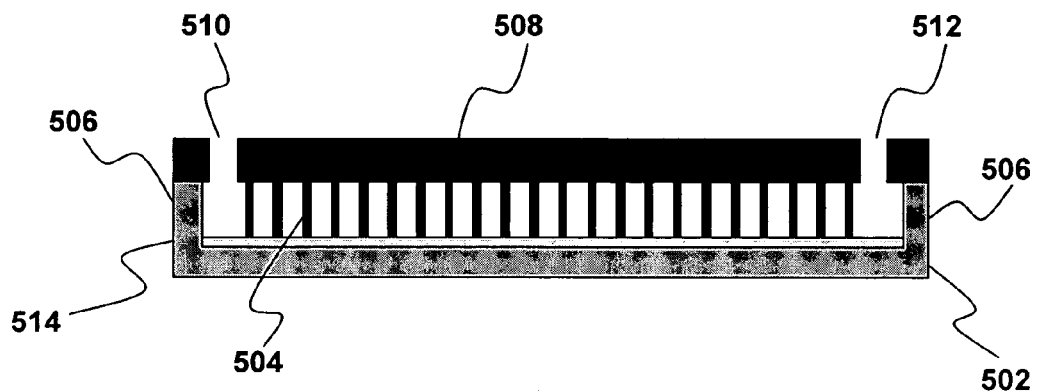
FIG. 5 illustrates an apparatus having a micropin thermal solution, in accordance with another embodiment.

FIG. 5 illustrates an apparatus having a micropin thermal solution, in accordance with another embodiment. Illustrated in FIG. 5, is a cross-sectional type view of an apparatus having a device 500. The device 500 includes a substrate 502 and a number of micropins 504. As shown in the embodiment, the substrate 502 provides a bottom of the device 500. Additionally, the device 500 includes a wall 506 that substantially surround the micropins 504 similar to the device 400 shown in FIG. 4. However, in the embodiment illustrated in FIG. 5, a cover 508 has the micropins 504 formed on the cover 508. Here again, the micropins 504 are substantially enclosed in the device 500.

The device 500 has an inlet 510 and an outlet 512. As will be described in detail, the inlet 510 and the outlet 512 facilitates flow of material through the micropins 504. Additionally, in FIG. 5, an interface layer 514 is shown between the micropins 504 and the substrate 502. The interface layer 514 may be any type of layer that facilitates a seal between the micropins 504 and the substrate 502. Accordingly, the interface layer 514 may be of a solderable material, adhesive material, or any combination thereof.

As previously alluded to, the cover 508 having the micropins 504 may be of any material such as, but not limited to, silicon and metal. Additionally, in the illustrate embodiment, the cover 508, having the micropins 504, may be formed as described in FIG. 2 (i.e., various etching methods).

In FIGS. 1–5, the number of micropins may be arranged in the pixel like pattern as shown in FIG. 1b. Additionally, as previously described, the substrate may be an IC die. Alternatively, the substrate may be a substrate that is thermally coupled to an IC die. It should be appreciated by those skilled in the art that the substrate and the micropins may be thermally coupled via various thermal interface materials (TIMs).

In one embodiment, each of the micropins may have the following approximate overall dimensions: 50 microns in width, 50 microns in thickness, and a height of 300 microns. Referring to FIG. 1b, in one example arrangement, the pitch may be approximately 50 microns and the substrate may have approximate dimensions of 1 centimeter by 1 centimeter. Accordingly, in the example arrangement, the number of pins may be approximately 10000 micropins.

Various thermal and mechanical considerations may have an effect on the material utilized for the interface layer and/or the adhesive layer (not shown). For example, thermal considerations may include the coefficient of thermal expansion (CTE) considerations, thermal conductivity, and the like. Some mechanical considerations may include toughness, strength, and the like. Further, in various embodiments, the micropins 104 may be of any type of shape such as, but not limited to, a primitive geometric shape and a complex geometric shape. For example the micropins 104 may be cylindrical, rectangular, etc. including shapes without symmetry.

Figure 6A:
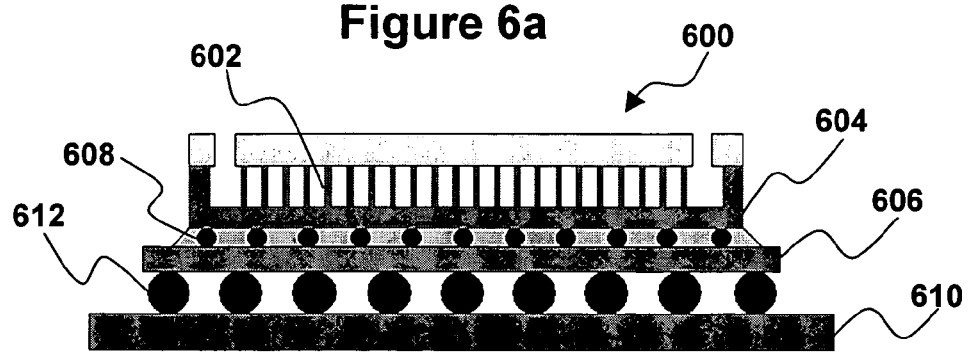
FIGS. 6a–6b illustrate an apparatus having a micropin thermal solution, in accordance with various embodiments.
Figure 6B:
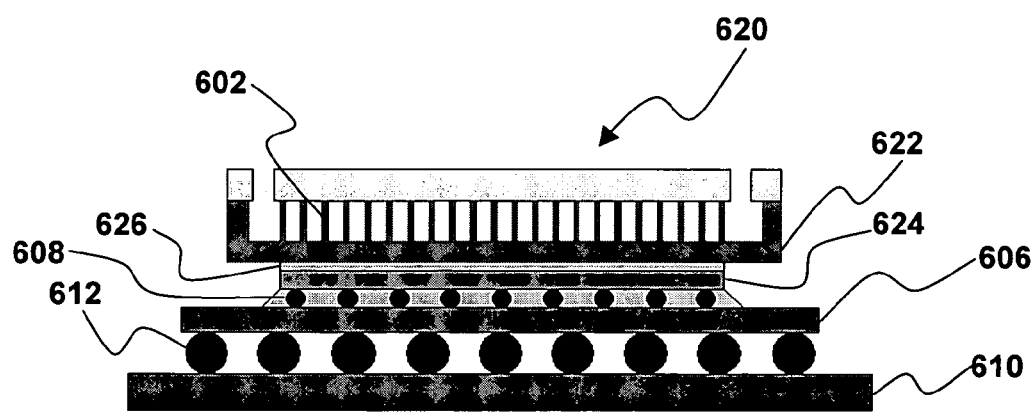

FIGS. 6a–6b illustrate an apparatus having a micropin thermal solution, in accordance with various embodiments. Illustrated in FIG. 6a is a cross-sectional type view of an electronic system 600 having apparatuses that may be representative of the apparatuses shown in FIGS. 1–5 having micropins 602. The electronic system 600 is shown having the micropins 602 disposed directly on top of an IC die 604 (i.e., the micropins 602 are thermally coupled to the IC die 604). The IC die 604 may be electrically coupled to a substrate 606 via a number of solder bumps 608. The substrate 606 may be electrically coupled to a wiring board 610 via solder balls 612. Accordingly, heat generated by the IC die 604 may be transferred to the micropins 602.

Turning now to FIG. 6b, shown in FIG. 6b is a cross-sectional type view of an electronic system 620 having apparatus 620 that may be representative of the apparatuses shown in FIGS. 1–5 having micropins 602. In FIG. 6b, the micropins 602 are shown thermally coupled to a substrate 622, which in turn may be thermally coupled to an IC die 624. Shown in FIG. 6b, an interface layer 626 may be disposed between the substrate 622 and the IC die 624. As previously alluded to, the interface layer 626 may be a TIM that facilitates thermal coupling of the substrate 622 with the IC die 626, thereby facilitating heat transfer from the IC die 626 to the micropins 602.

Continuing to refer to FIG. 6b, the apparatus 620 is shown thermally coupled to the IC die 622. The IC die may be electrically coupled to the substrate 606 via solder bumps 608. The substrate 606 may be electrically coupled to the wiring board 610 via solder balls 612. Here again, the heat generated by the IC die 622 may be transferred to the micropins 602 because effectively, the micropins 602 may be thermally coupled to the IC die 622.

Shown in FIGS. 6a–6b, the micropins 602 are substantially enclosed in the device 600 & 620. However, as described previously, the micropins 602 need not be substantially enclosed (see FIGS. 1–3). Additionally, in various embodiments, the wiring board 610 may have various devices electrically coupled to it such as, but not limited to a memory device (e.g., a flash memory device).

Figure 7A:
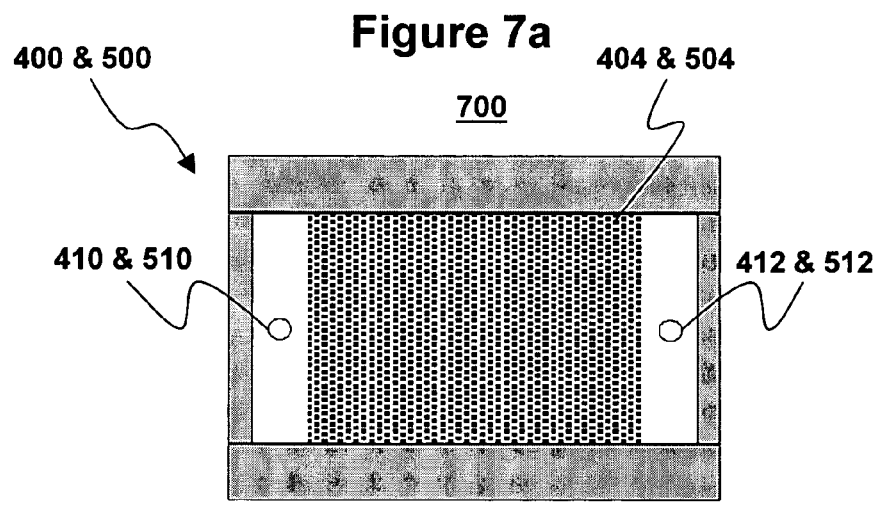
FIGS. 7a–7b illustrate a micropin thermal solution, in accordance with various embodiments.
Figure 7B:
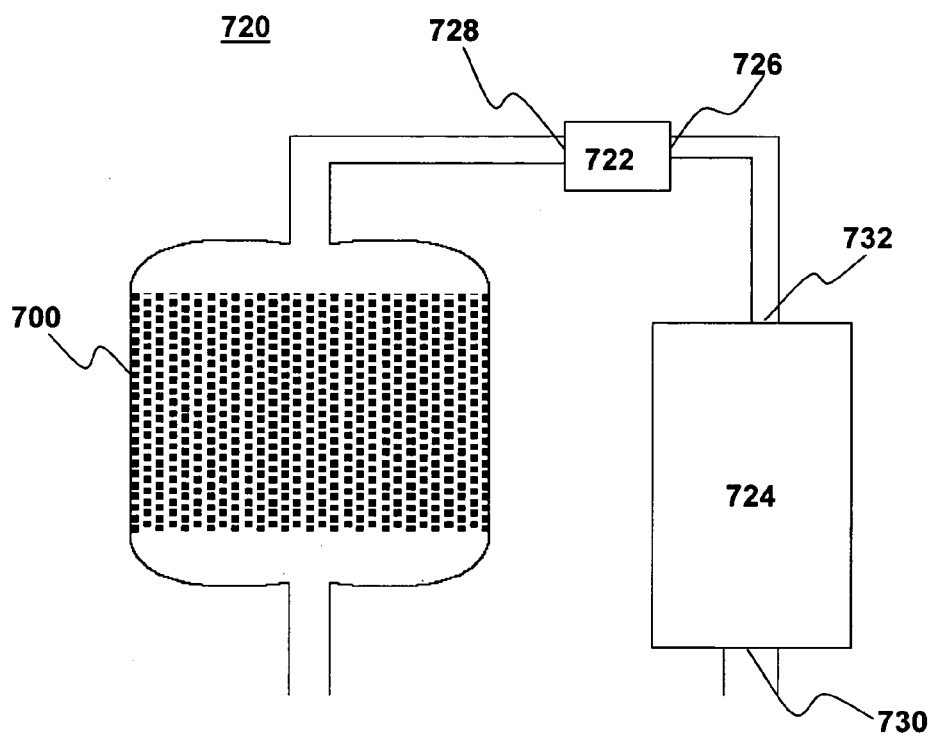

FIGS. 7a–7b illustrate a micropin thermal solution, in accordance with various embodiments. Illustrated in FIG. 7a is a top like view of an apparatus 700 that may be representative of the apparatuses shown in FIGS. 4–6. Accordingly, the apparatus has the number of micropins 404 & 504 substantially enclosed the device 400 & 500. Additionally, the device 400 & 500 has the inlet 410 & 510 and the outlet 412 & 512. As shown, the micropins 404 & 504 are arranged in the pixel like pattern as previously described.

Referring now to FIG. 7b, the apparatus 700 may be included in a heat exchange system. Shown in FIG. 7b is a simplified view of a heat exchange system 720. The heat exchange system 720 includes the apparatus 700, a pump 722, and a heat exchanger 724.

As previously described, the apparatus 700 has the inlet 410 & 510 and the outlet 412 & 512. The pump 722 has an inlet 726 and an outlet 728. The heat exchanger 724 has an inlet 730 and an outlet 732. As shown in FIG. 7, the outlet of the pump 728 may be coupled to the inlet 410 & 510 of the apparatus 700 (i.e., device) to facilitate transfer of material (i.e., material transferably coupled). The inlet 726 of the pump 728 may be material transferably coupled to the outlet 732 of the heat exchanger 724. The outlet 412 & 512 may be material transferably coupled to the inlet 730 of the heat exchanger 724.

As shown in FIG. 7b, a material such as, but not limited to, liquid water may be pumped to the apparatus 700. The micropins, being thermally coupled to an IC die, facilitate heat transfer to the liquid water. As more heat is transferred to the liquid water, the liquid water may become steam. Further, as varying areas of the IC die generate varying amounts of heat, utilization of micropins and the manner in which the micropins are arranged facilitates uniform cooling of the IC die.

The pump 722 and the heat exchanger 724 may be any type of pump and heat exchanger such as, but not limited to, an electroosmotic pump. Additionally, the material utilized for the heat exchange system 720 may be any material such as, but not limited to, fluid, gas, and nanoparticles.

In the illustrated embodiment of FIG. 7b, the pump 722 provides material to the apparatus 700. The apparatus facilitates removal of heat from an IC die, as previously described. The heat exchanger 724 receives the heated material and removes the heat to another heat sink (not shown). It should be appreciated that in order not to obscure the embodiments of the invention, various components of the heat exchange system 720 are not shown. For example, there may various valves, seals, and so forth.

Having described and illustrated the principles of the invention with reference to illustrated embodiments, it will be recognized that the illustrated embodiments can be modified in arrangement and detail without departing from such principles. And, though the foregoing discussion has focused on particular embodiments, other configurations are contemplated. In particular, even though expressions such as "in one embodiment," "in another embodiment," or the like are used herein, these phrases are meant to generally reference embodiment possibilities, and are not intended to limit the invention to particular embodiment configurations. As used herein, these terms may reference the same or different embodiments that are combinable into other embodiments.

Thus, it can be seen from the above descriptions, a novel apparatus including a micropin thermal solution has been described.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. Thus, the description is to be regarded as illustrative instead of restrictive on the invention.

Consequently, in view of the wide variety of permutations to the embodiments described herein, this detailed description is intended to be illustrative only, and should not be taken as limiting the scope of the invention. What is claimed as the invention, therefore, is all such modifications as may come within the scope and spirit of the following claims and equivalents thereto.

What is claimed is:

1. An apparatus comprising:
   a substrate, the substrate further comprising a thermal interface layer; and
   a plurality of micropins thermally coupled to the substrate, the plurality of micropins arranged in a pixel like pattern over the substrate, the micropins positioned to cause a fluid passing through the plurality of micropins to travel a nonstraight path, wherein the spacing between the micropins is based on the fluid that passes through the plurality of micropins, wherein the thermal interface layer is disposed between the plurality of micropins and the substrate.

2. The apparatus of claim 1, wherein the plurality of micropins comprises a plurality of micropins formed from the substrate.

3. The apparatus of claim 1, wherein the substrate comprises an integrated circuit (IC) die.

4. The apparatus of claim 1, wherein the plurality of micropins comprises a plurality of micropins coupled to the thermal interface layer, the thermal interface layer thermally coupled to the substrate.

5. The apparatus of claim 4, wherein the thermal interface layer comprises a diamond film.

6. The apparatus of claim 4, wherein the thermal interface layer comprises a solderable layer.

7. The apparatus of claim 6, wherein the solderable layer comprises a solderable layer formed from at least one of copper (Cu), gold (Au), nickel (Ni), aluminum (Al), titanium (Ti), tantalum (Ta), silver (Ag), and Platinum (Pt).

8. The apparatus of claim 1, wherein the plurality of micropins comprises a plurality of micropins substantially enclosed in a device, the device having a cover disposed over the plurality of micropins.

9. The apparatus of claim 8, wherein the device further comprises an inlet and an outlet.

10. The apparatus of claim 9 further comprising a pump, the pump having an outlet, the outlet material transferably coupled to the inlet of the device.

11. The apparatus of claim 1, wherein the plurality of micropins comprises a plurality of micropins substantially enclosed in a device, the device includes a cover having the plurality of micropins formed thereon.

12. The apparatus of claim 11, wherein the device further comprises an inlet and an outlet.

13. The apparatus of claim 12 further comprising a pump, the pump having an outlet, the outlet material transferably coupled to the inlet of the device.

14. The apparatus of claim 1, wherein each of the plurality of micropins comprises a micropin having a primitive geometric shape.

15. The apparatus of claim 1, wherein each of the plurality of micropins comprises a micropin having a width of about 50 microns, a thickness of 50 microns, and a height of 300 microns.

16. The apparatus of claim 1, wherein the plurality of micropins comprises a plurality of micropins arranged to facilitate flow of material across the plurality of micropins in at least two directions.

17. The apparatus of claim 1, wherein the plurality of micropins have a complex geometric shape.

18. The apparatus of claim 1, further comprising a cover for the substrate, the cover including a plurality of micropins.

19. The apparatus of claim 1, wherein the plurality of micropins are positioned to cause a fluid passing through the plurality of micropins to travel a tortuous path.

20. The apparatus of claim 1, wherein the plurality of micropins are positioned to cause a fluid passing through the plurality of micropins to travel a nonstraight path the micropins having nonuniform dimensions.

21. A heat exchange system comprising:
a device having an inlet and an outlet, comprising:
a substrate, and
a plurality of micropins thermally coupled to the substrate, the plurality of micropins arranged to facilitate flow of material across the plurality of micropins in at least two directions, and arranged in a pixel like pattern over the substrate; and
a thermal interface layer associated with the substrate, the thermal interface layer having a different thermal conductivity than the substrate;
a pump, the pump having an inlet and an outlet, the outlet of the pump material transferably coupled to the inlet of the device; and
a heat exchanger, the heat exchanger having an inlet and an outlet, the inlet of the heat exchanger material transferably coupled to the outlet of the device, and the outlet of the heat exchanger material transferably coupled to the inlet of the pump.

22. The heat exchange system of claim 21, wherein the plurality of micropins comprises a plurality of micropins formed from the substrate.

23. The heat exchange system of claim 21 further comprising an integrated circuit (IC) die thermally coupled to the plurality of micropins.

24. The heat exchange system of claim 21, wherein the device comprises a device substantially enclosing the plurality of micropins, the device having a cover disposed over the plurality of micropins.

25. The heat exchange system of claim 21, wherein the device comprises a device substantially enclosing the plurality of micropins, the device including a cover having the plurality of micropins formed thereon.

26. An electronic system comprising:
a substrate, the substrate thermally coupled to an integrated circuit (IC) die;
a plurality of micropins thermally coupled to the substrate, the plurality of micropins arranged in a pixel like pattern over the substrate, the micropins positioned to cause a fluid passing through the plurality of micropins to travel a nonstraight path, wherein the substrate includes a thermal interface layer associated with the substrate, the thermal interface layer positioned between the micropins and a portion of the substrate;
a wiring board electrically coupled to the IC die; and
a memory device electrically coupled to the wiring board.

27. The electronic system of claim 26, wherein the plurality of micropins comprises a plurality of micropins formed from the substrate.

28. The electronic system of claim 26, wherein the plurality of micropins comprise a plurality of micropins substantially enclosed in a device, the device having a cover disposed over the plurality of micropins.

29. The electronic system of claim 28, wherein the device further comprises an inlet and an outlet.

30. The electronic system of claim 29 further comprising a pump, the pump having an outlet, the outlet coupled to the inlet of the device.

31. The electronic system of claim 26, wherein the plurality of micropins comprises a plurality of micropins substantially enclosed in a device, the device includes a cover having the plurality of micropins formed thereon.

32. The electronic system of claim 31, wherein the device further comprises an inlet and an outlet.

33. The electronic system of claim 32 further comprising a pump, the pump having an outlet, the outlet material transferably coupled to the inlet of the device.

34. The electronic system of claim 26, wherein the memory device comprises a flash memory device.

35. An electronic system comprising:
- a substrate, the substrate thermally coupled to an integrated circuit (IC) die, the substrate including a thermal interface layer;
- a plurality of micropins thermally coupled to the substrate, the plurality of micropins arranged to facilitate flow of material in a nonstraight path across the plurality of micropins in a pixel like pattern over the substrate, and substantially enclosed in a device, the device having an inlet and an outlet, the thermal interface layer positioned between a portion of the substrate and the micropins;
- a pump, the pump having an inlet and an outlet, the outlet of the pump material transferably coupled to the inlet of the device;
- a heat exchanger, the heat exchanger having an inlet and an outlet, the inlet of the heat exchanger material transferably coupled to the outlet of the device, and the outlet of the heat exchanger material transferably coupled to the inlet of the pump;
- a wiring board electrically coupled to the substrate; and
- a memory device electrically coupled to the wiring board.

36. The electronic system of claim 35, wherein the plurality of micropins comprises a plurality of micropins formed from the substrate.

37. The electronic system of claim 35, wherein the device comprises a device having a cover disposed over the plurality of micropins.

38. The electronic system of claim 35, wherein the device comprises a device having a cover, the cover having the plurality of micropins formed thereon.

39. The electronic system of claim 35, wherein the memory device comprises a flash memory device.

* * * * *